(12) United States Patent
Kawanishi

(10) Patent No.: US 6,810,091 B1
(45) Date of Patent: Oct. 26, 2004

(54) DIGITAL DATA DEINTERLEAVER

(75) Inventor: Hiroyuki Kawanishi, Yokohama (JP)

(73) Assignee: Nippion Precision Circuits, Inc., Tokyo (JP)

( * ) Notice: Subject to any disclaimer, the term of this patent is extended or adjusted under 35 U.S.C. 154(b) by 0 days.

(21) Appl. No.: 09/295,916

(22) Filed: Apr. 21, 1999

(30) Foreign Application Priority Data

Apr. 22, 1998 (JP) .......................................... 10-112133

(51) Int. Cl.[7] .............................................. H03K 9/00
(52) U.S. Cl. ..................................................... 375/316
(58) Field of Search ................................ 375/316, 377, 375/341, 262, 372; 714/794, 762, 795, 763, 702; 711/104, 202, 157

(56) References Cited

U.S. PATENT DOCUMENTS

| | | | | |
|---|---|---|---|---|
| 5,537,420 A | * | 7/1996 | Huang ......................... | 714/701 |
| 5,572,532 A | * | 11/1996 | Fimoff et al. ............... | 714/702 |
| 5,918,204 A | * | 6/1999 | Tsurumaru ................... | 704/214 |

FOREIGN PATENT DOCUMENTS

| | | |
|---|---|---|
| JP | 58-15353 | 1/1983 |
| JP | 63-128820 | 6/1988 |
| JP | 7-60413 | 6/1995 |

* cited by examiner

*Primary Examiner*—Khai Tran
(74) *Attorney, Agent, or Firm*—Schulte Roth & Zabel LLP; Joel E. Lutzker; John C. Garces

(57) ABSTRACT

There is disclosed a reduced-scale digital data deinterleaver of simple structure. In a preferred embodiment each word is comprised of 32 bits of data, and 32 words form a block. In each block, each word is separated into four phases cyclically. The resulting bit lines and word lines are interchanged to produce interleaved data items. One block of the interleaved data items is written into a RAM. A higher significant address of 5 bits and a lower significant address of 5 bits of the RAM are specified by the higher significant 5 bits and the lower significant 5 bits, respectively, of the output from a counter. Whenever a block of data is written to the RAM the higher significant 5 bits and the lower significant 5 bits are interchanged to produce first and second count signals. Data is read from the specified address, 1 bit at a time and data is written, 1 bit at a time, into the address just from which data was read out. When the most and lower significant 5 bits are interchanged as described above, the higher significant 2 bits of the higher significant 5 bits and higher significant 2 bits of the lower significant 5 bits are alternately shifted toward lower significant bits.

6 Claims, 8 Drawing Sheets

| Block Number | Higher Significant Address Lines | Lower Significant Address Lines | Count Value of the Counter 03 | Count Value of the Counter 04 |
|---|---|---|---|---|
| 1 | RA[9, 8, 7, 6, 5] | RA[4, 3, 2, 1, 0] | | |
| 2 | CA[9, 8, 7, 6, 5] | CA[4, 3, 2, 1, 0] | 0 | 0 |
| 3 | CA[4, 3, 2, 1, 0] | CA[7, 6, 5, 9, 8] | 1 | |
| 4 | CA[7, 6, 5, 9, 8] | CA[2, 1, 0, 4, 3] | | 1 |
| 5 | CA[2, 1, 0, 4, 3] | CA[5, 9, 8, 7, 6] | 2 | |
| 6 | CA[5, 9, 8, 7, 6] | CA[0, 4, 3, 2, 1] | | 2 |
| 7 | CA[0, 4, 3, 2, 1] | CA[8, 7, 6, 5, 9] | 3 | |
| 8 | CA[8, 7, 6, 5, 9] | CA[3, 2, 1, 0, 4] | | 3 |
| 9 | CA[3, 2, 1, 0, 4] | CA[6, 5, 9, 8, 7] | 4 | |
| 10 | CA[6, 5, 9, 8, 7] | CA[1, 0, 4, 3, 2] | | 4 |
| 11 | CA[1, 0, 4, 3, 2] | CA[9, 8, 7, 6, 5] | 0 | |
| 12 | CA[9, 8, 7, 6, 5] | CA[4, 3, 2, 1, 0] | | 0 |
| | CA[4, 3, 2, 1, 0] | CA[7, 6, 5, 9, 8] | 1 | |

| Lower Significant Address | 0 | 1 | 2 | 3 | 4 | 5 | 6 | 7 | 8 | 9 | 10 | 11 | 12 | 13 | 14 | 15 | ... | 30 | 31 |
|---|---|---|---|---|---|---|---|---|---|---|---|---|---|---|---|---|---|---|---|
| Higher Significant Address | | | | | | | | | | | | | | | | | | | |
| 0 | a0(0) | b0(0) | c0(0) | d0(0) | a1(0) | b1(0) | c1(0) | d1(0) | a2(0) | b2(0) | c2(0) | d2(0) | a3(0) | b3(0) | c3(0) | d3(0) | ... | c7(0) | d7(0) |
| 1 | a0(1) | b0(1) | c0(1) | d0(1) | a1(1) | b1(1) | c1(1) | d1(1) | a2(1) | b2(1) | c2(1) | d2(1) | a3(1) | b3(1) | c3(1) | d3(1) | ... | c7(1) | d7(1) |
| 2 | a0(2) | b0(2) | c0(2) | d0(2) | a1(2) | b1(2) | c1(2) | d1(2) | a2(2) | b2(2) | c2(2) | d2(2) | a3(2) | b3(2) | c3(2) | d3(2) | ... | c7(2) | d7(2) |
| 3 | a0(3) | b0(3) | c0(3) | d0(3) | a1(3) | b1(3) | c1(3) | d1(3) | a2(3) | b2(3) | c2(3) | d2(3) | a3(3) | b3(3) | c3(3) | d3(3) | ... | c7(3) | d7(3) |
| 4 | a0(4) | b0(4) | c0(4) | d0(4) | a1(4) | b1(4) | c1(4) | d1(4) | a2(4) | b2(4) | c2(4) | d2(4) | a3(4) | b3(4) | c3(4) | d3(4) | ... | c7(4) | d7(4) |
| 5 | a0(5) | b0(5) | c0(5) | d0(5) | a1(5) | b1(5) | c1(5) | d1(5) | a2(5) | b2(5) | c2(5) | d2(5) | a3(5) | b3(5) | c3(5) | d3(5) | ... | c7(5) | d7(5) |
| 6 | a0(6) | b0(6) | c0(6) | d0(6) | a1(6) | b1(6) | c1(6) | d1(6) | a2(6) | b2(6) | c2(6) | d2(6) | a3(6) | b3(6) | c3(6) | d3(6) | ... | c7(6) | d7(6) |
| 7 | a0(7) | b0(7) | c0(7) | d0(7) | a1(7) | b1(7) | c1(7) | d1(7) | a2(7) | b2(7) | c2(7) | d2(7) | a3(7) | b3(7) | c3(7) | d3(7) | ... | c7(7) | d7(7) |
| 8 | a0(8) | b0(8) | c0(8) | d0(8) | a1(8) | b1(8) | c1(8) | d1(8) | a2(8) | b2(8) | c2(8) | d2(8) | a3(8) | b3(8) | c3(8) | d3(8) | ... | c7(8) | d7(8) |
| 9 | a0(9) | b0(9) | c0(9) | d0(9) | a1(9) | b1(9) | c1(9) | d1(9) | a2(9) | b2(9) | c2(9) | d2(9) | a3(9) | b3(9) | c3(9) | d3(9) | ... | c7(9) | d7(9) |
| 10 | a0(10) | b0(10) | c0(10) | d0(10) | a1(10) | b1(10) | c1(10) | d1(10) | a2(10) | b2(10) | c2(10) | d2(10) | a3(10) | b3(10) | c3(10) | d3(10) | ... | c7(10) | d7(10) |
| 11 | a0(11) | b0(11) | c0(11) | d0(11) | a1(11) | b1(11) | c1(11) | d1(11) | a2(11) | b2(11) | c2(11) | d2(11) | a3(11) | b3(11) | c3(11) | d3(11) | ... | c7(11) | d7(11) |
| 12 | a0(12) | b0(12) | c0(12) | d0(12) | a1(12) | b1(12) | c1(12) | d1(12) | a2(12) | b2(12) | c2(12) | d2(12) | a3(12) | b3(12) | c3(12) | d3(12) | ... | c7(12) | d7(12) |
| 13 | a0(13) | b0(13) | c0(13) | d0(13) | a1(13) | b1(13) | c1(13) | d1(13) | a2(13) | b2(13) | c2(13) | d2(13) | a3(13) | b3(13) | c3(13) | d3(13) | ... | c7(13) | d7(13) |
| 14 | a0(14) | b0(14) | c0(14) | d0(14) | a1(14) | b1(14) | c1(14) | d1(14) | a2(14) | b2(14) | c2(14) | d2(14) | a3(14) | b3(14) | c3(14) | d3(14) | ... | c7(14) | d7(14) |
| 15 | a0(15) | b0(15) | c0(15) | d0(15) | a1(15) | b1(15) | c1(15) | d1(15) | a2(15) | b2(15) | c2(15) | d2(15) | a3(15) | b3(15) | c3(15) | d3(15) | ... | c7(15) | d7(15) |
| ... | ... | ... | ... | ... | ... | ... | ... | ... | ... | ... | ... | ... | ... | ... | ... | ... | ... | ... | ... |
| 24 | a0(24) | b0(24) | c0(24) | d0(24) | a1(24) | b1(24) | c1(24) | d1(24) | a2(24) | b2(24) | c2(24) | d2(24) | a3(24) | b3(24) | c3(24) | d3(24) | ... | c7(24) | d7(24) |
| 25 | a0(25) | b0(25) | c0(25) | d0(25) | a1(25) | b1(25) | c1(25) | d1(25) | a2(25) | b2(25) | c2(25) | d2(25) | a3(25) | b3(25) | c3(25) | d3(25) | ... | c7(25) | d7(25) |
| 26 | a0(26) | b0(26) | c0(26) | d0(26) | a1(26) | b1(26) | c1(26) | d1(26) | a2(26) | b2(26) | c2(26) | d2(26) | a3(26) | b3(26) | c3(26) | d3(26) | ... | c7(26) | d7(26) |
| 27 | a0(27) | b0(27) | c0(27) | d0(27) | a1(27) | b1(27) | c1(27) | d1(27) | a2(27) | b2(27) | c2(27) | d2(27) | a3(27) | b3(27) | c3(27) | d3(27) | ... | c7(27) | d7(27) |
| 28 | a0(28) | b0(28) | c0(28) | d0(28) | a1(28) | b1(28) | c1(28) | d1(28) | a2(28) | b2(28) | c2(28) | d2(28) | a3(28) | b3(28) | c3(28) | d3(28) | ... | c7(28) | d7(28) |
| 29 | a0(29) | b0(29) | c0(29) | d0(29) | a1(29) | b1(29) | c1(29) | d1(29) | a2(29) | b2(29) | c2(29) | d2(29) | a3(29) | b3(29) | c3(29) | d3(29) | ... | c7(29) | d7(29) |
| 30 | a0(30) | b0(30) | c0(30) | d0(30) | a1(30) | b1(30) | c1(30) | d1(30) | a2(30) | b2(30) | c2(30) | d2(30) | a3(30) | b3(30) | c3(30) | d3(30) | ... | c7(30) | d7(30) |
| 31 | a0(31) | b0(31) | c0(31) | d0(31) | a1(31) | b1(31) | c1(31) | d1(31) | a2(31) | b2(31) | c2(31) | d2(31) | a3(31) | b3(31) | c3(31) | d3(31) | ... | c7(31) | d7(31) |

| | bit 0 | 1 | 2 | 3 | ........ | 30 | 31 |
|---|---|---|---|---|---|---|---|
| Word Number 0 | a0(0) | a0(1) | a0(2) | a0(3) | ........ | a0(30) | a0(31) |
| Word Number 1 | b0(0) | b0(1) | b0(2) | b0(3) | ........ | b0(30) | b0(31) |
| Word Number 2 | c0(0) | c0(1) | c0(2) | c0(3) | ........ | c0(30) | c0(31) |
| Word Number 3 | d0(0) | d0(1) | d0(2) | d0(3) | ........ | d0(30) | d0(31) |
| Word Number 4 | a1(0) | a1(1) | a1(2) | a1(3) | ........ | a1(30) | a1(31) |
| Word Number 5 | b1(0) | b1(1) | b1(2) | b1(3) | ........ | b1(30) | b1(31) |
| Word Number 6 | c1(0) | c1(1) | c1(2) | c1(3) | ........ | c1(30) | c1(31) |
| Word Number 7 | d1(0) | d1(1) | d1(2) | d1(3) | ........ | d1(30) | d1(31) |
| Word Number 8 | a2(0) | a2(1) | a2(2) | a2(3) | ........ | a2(30) | a2(31) |
| Word Number 9 | b2(0) | b2(1) | b2(2) | b2(3) | ........ | b2(30) | b2(31) |
| Word Number 10 | c2(0) | c2(1) | c2(2) | c2(3) | ........ | c2(30) | c2(31) |
| Word Number 11 | d2(0) | d2(1) | d2(2) | d2(3) | ........ | d2(30) | d2(31) |
| Word Number 12 | a3(0) | a3(1) | a3(2) | a3(3) | ........ | a3(30) | a3(31) |
| Word Number 13 | b3(0) | b3(1) | b3(2) | b3(3) | ........ | b3(30) | b3(31) |
| Word Number 14 | c3(0) | c3(1) | c3(2) | c3(3) | ........ | c3(30) | c3(31) |
| Word Number 15 | d3(0) | d3(1) | d3(2) | d3(3) | ........ | d3(30) | d3(31) |
| ... | ... | ... | ... | ... | | ... | ... |
| Word Number 24 | a6(0) | a6(1) | a6(2) | a6(3) | ........ | a6(30) | a6(31) |
| Word Number 25 | b6(0) | b6(1) | b6(2) | b6(3) | ........ | b6(30) | b6(31) |
| Word Number 26 | c6(0) | c6(1) | c6(2) | c6(3) | ........ | c6(30) | c6(31) |
| Word Number 27 | d6(0) | d6(1) | d6(2) | d6(3) | ........ | d6(30) | d6(31) |
| Word Number 28 | a7(0) | a7(1) | a7(2) | a7(3) | ........ | a7(30) | a7(31) |
| Word Number 29 | b7(0) | b7(1) | b7(2) | b7(3) | ........ | b7(30) | b7(31) |
| Word Number 30 | c7(0) | c7(1) | c7(2) | c7(3) | ........ | c7(30) | c7(31) |
| Word Number 31 | d7(0) | d7(1) | d7(2) | d7(3) | ........ | d7(30) | d7(31) |

FIG.7
PRIOR ART

| Lower Significant Address<br>Higher Significant Address | 0 | 1 | 2 | 3 | ....... | 30 | 31 |
|---|---|---|---|---|---|---|---|
| 0 | a0(0) | b0(0) | c0(0) | d0(0) | ....... | c7(0) | d7(0) |
| 1 | a0(1) | b0(1) | c0(1) | d0(1) | ....... | c7(1) | d7(1) |
| 2 | a0(2) | b0(2) | c0(2) | d0(2) | ....... | c7(2) | d7(2) |
| 3 | a0(3) | b0(3) | c0(3) | d0(3) | ....... | c7(3) | d7(3) |
| 4 | a0(4) | b0(4) | c0(4) | d0(4) | ....... | c7(4) | d7(4) |
| 5 | a0(5) | b0(5) | c0(5) | d0(5) | ....... | c7(5) | d7(5) |
| 6 | a0(6) | b0(6) | c0(6) | d0(6) | ....... | c7(6) | d7(6) |
| 7 | a0(7) | b0(7) | c0(7) | d0(7) | ....... | c7(7) | d7(7) |
| 8 | a0(8) | b0(8) | c0(8) | d0(8) | ....... | c7(8) | d7(8) |
| 9 | a0(9) | b0(9) | c0(9) | d0(9) | ....... | c7(9) | d7(9) |
| 10 | a0(10) | b0(10) | c0(10) | d0(10) | ....... | c7(10) | d7(10) |
| 11 | a0(11) | b0(11) | c0(11) | d0(11) | ....... | c7(11) | d7(11) |
| 12 | a0(12) | b0(12) | c0(12) | d0(12) | ....... | c7(12) | d7(12) |
| 13 | a0(13) | b0(13) | c0(13) | d0(13) | ....... | c7(13) | d7(13) |
| 14 | a0(14) | b0(14) | c0(14) | d0(14) | ....... | c7(14) | d7(14) |
| 15 | a0(15) | b0(15) | c0(15) | d0(15) | ....... | c7(15) | d7(15) |
| ... | ... | ... | ... | ... | | ... | ... |
| 24 | a0(24) | b0(24) | c0(24) | d0(24) | ....... | c7(24) | d7(24) |
| 25 | a0(25) | b0(25) | c0(25) | d0(25) | ....... | c7(25) | d7(25) |
| 26 | a0(26) | b0(26) | c0(26) | d0(26) | ....... | c7(26) | d7(26) |
| 27 | a0(27) | b0(27) | c0(27) | d0(27) | ....... | c7(27) | d7(27) |
| 28 | a0(28) | b0(28) | c0(28) | d0(28) | ....... | c7(28) | d7(28) |
| 29 | a0(29) | b0(29) | c0(29) | d0(29) | ....... | c7(29) | d7(29) |
| 30 | a0(30) | b0(30) | c0(30) | d0(30) | ....... | c7(30) | d7(30) |
| 31 | a0(31) | b0(31) | c0(31) | d0(31) | ....... | c7(31) | d7(31) |

FIG.8
PRIOR ART

| Higher Significant Address \ Lower Significant Address | 0 | 1 | 2 | 3 | ....... | 30 | 31 |
|---|---|---|---|---|---|---|---|
| 0 | a0(0) | a0(1) | a0(2) | a0(3) | ....... | a0(30) | a0(31) |
| 1 | b0(0) | b0(1) | b0(2) | b0(3) | ....... | b0(30) | b0(31) |
| 2 | c0(0) | c0(1) | c0(2) | c0(3) | ....... | c0(30) | c0(31) |
| 3 | d0(0) | d0(1) | d0(2) | d0(3) | ....... | d0(30) | d0(31) |
| 4 | a1(0) | a1(1) | a1(2) | a1(3) | ....... | a1(30) | a1(31) |
| 5 | b1(0) | b1(1) | b1(2) | b1(3) | ....... | b1(30) | b1(31) |
| 6 | c1(0) | c1(1) | c1(2) | c1(3) | ....... | c1(30) | c1(31) |
| 7 | d1(0) | d1(1) | d1(2) | d1(3) | ....... | d1(30) | d1(31) |
| 8 | a2(0) | a2(1) | a2(2) | a2(3) | ....... | a2(30) | a2(31) |
| 9 | b2(0) | b2(1) | b2(2) | b2(3) | ....... | b2(30) | b2(31) |
| 10 | c2(0) | c2(1) | c2(2) | c2(3) | ....... | c2(30) | c2(31) |
| 11 | d2(0) | d2(1) | d2(2) | d2(3) | ....... | d2(30) | d2(31) |
| 12 | a3(0) | a3(1) | a3(2) | a3(3) | ....... | a3(30) | a3(31) |
| 13 | b3(0) | b3(1) | b3(2) | b3(3) | ....... | b3(30) | b3(31) |
| 14 | c3(0) | c3(1) | c3(2) | c3(3) | ....... | c3(30) | c3(31) |
| 15 | d3(0) | d3(1) | d3(2) | d3(3) | ....... | d3(30) | d3(31) |
| ... | ... | ... | ... | ... | | ... | ... |
| 24 | a6(0) | a6(1) | a6(2) | a6(3) | ....... | a6(30) | a6(31) |
| 25 | b6(0) | b6(1) | b6(2) | b6(3) | ....... | b6(30) | b6(31) |
| 26 | c6(0) | c6(1) | c6(2) | c6(3) | ....... | c6(30) | c6(31) |
| 27 | d6(0) | d6(1) | d6(2) | d6(3) | ....... | d6(30) | d6(31) |
| 28 | a7(0) | a7(1) | a7(2) | a7(3) | ....... | a7(30) | a7(31) |
| 29 | b7(0) | b7(1) | b7(2) | b7(3) | ....... | b7(30) | b7(31) |
| 30 | c7(0) | c7(1) | c7(2) | c7(3) | ....... | c7(30) | c7(31) |
| 31 | d7(0) | d7(1) | d7(2) | d7(3) | ....... | d7(30) | d7(31) |

DIGITAL DATA DEINTERLEAVER

BACKGROUND OF THE INVENTION

The present invention relates to a deinterleaver for deinterleaving data that has been transmitted in an interleaved format.

It is common practice in communications equipment, data storage devices, etc. to interleave transmitted data for suppressing burst errors produced in data transfer and to restore the data at the receiver by use of a deinterleaver.

The following interleaving/deinterleaving technique is known in the art. As shown in FIG. 6, with respect to interleaved data, 32 bits of data comprise a word, and 32 words (1024 bits) comprise a block. In each block, each word is separated into four phases a–d, and data is multiplexed so that words with four alternating phases are arranged. In transmitting data, bit lines and word lines are interchanged to interleave a block of data. In particular, each data item as shown in FIG. 6 is identified by [phase name], [word number], and ([bit number]). After the interleaving process is completed, data is transmitted, 1 bit at a time, in the order a0(0), b0(0), c0(0), d0(0), a1(0), ..., d6(31), a7(31), b7(31), c7(31), d7(31).

Data interleaved in the above matter have been deinterleaved by a deinterleaver having the following structure. The deinterleaver is comprised of a first 1024-bit RAM permitting data to be read and written, 1 bit at a time, to interchange bit lines and word lines; a second 1024-bit RAM for separation of phases; and the respective address counters for the first RAM and second RAM. Let RA[9, 8, 7, 6, 5] be the higher significant 5-bit address lines for specifying higher significant addresses of the 1024 bits in the first RAM permitting data to be read and written, 1 bit at a time, and RA[4, 3, 2, 1, 0] be the lower significant 5-bit address lines for specifying lower significant addresses. The output from the address counter consisting of 10 bits for addressing is divided into higher significant 5 bits and lower significant 5 bits, which are indicated by CA[9, 8, 7, 6, 5] and CA[4, 3, 2, 1, 0], respectively. For convenience, RA[9, 8, 7, 6, 5] is given by RA[9:5].

The higher significant 5-bit output CA[9:5] and the lower significant 5 bit output CA[4:0] can be alternately coupled to the address lines RA[9:5] and RA[4:0] by selectors. Thus, whenever writing of a block of data is completed, the higher significant 5-bit output and the lower significant 5-bit output from the address counter are interchanged and the data written to RAM is read out. Every subsequent block written to RAM is directly written into the address from which data has been just read out. Consequently, bit lines and word lines are interchanged.

Specifically, with respect to the first block, the higher significant 5-bit output and the lower significant 5-bit output from the address counter are not interchanged and written without modification as illustrated in FIG. 7. In this figure, the rows indicate higher significant addresses 0–31 in the RAM specified by the higher significant 5-bit output from the address counter and the columns indicate lower significant addresses 0–31 specified by the lower significant 5-bit output. For convenience, the higher and lower significant addresses are represented in decimal notation and in the description given below, decimal notation is also used. Similar rules are applied to the addresses in the storage device specified by higher and lower significant addresses. With respect to the first block, writing is done in the direction of rows. As a result, data is written into the RAM while interchanging the word lines and bit lines of the original data format shown in FIG. 6. Then, the higher significant 5 bits and the lower significant 5 bits of the output from the address counter are interchanged and read out in the direction of columns. More specifically, with respect to the lower significant address 0 shown in FIG. 7, data is read out up to higher significant addresses 0–31. Then, with respect to lower significant address 1, data are read out up to higher significant addresses 0–31. In this way, data is read out up to the final lower significant address 31. The word lines and bit lines are again interchanged to regain the original data format shown in FIG. 6, in outputting data. One bit of data is output at a time in the order a0(0), a0(1), a0(31), b0(0), . . . , b0(31), c0(0), . . . , c0(31), d7(0), d7(31). Simultaneously with the reading, data in the second block is written, 1 bit at a time, into the address just read out. When the writing of the data in the second block is complete, a data array as shown in FIG. 8 is obtained. Subsequently, the higher significant bits and the lower significant bits of the output from the address counter are again interchanged and data is read out. Concurrently, data in the third block are written as it is into the address of the data just read.

Words with phases a–d cyclically appear at the output data of the RAM. It is necessary to perform phase separation (i.e., words must be rearranged according to each of the phases a–d). Therefore, an output consisting of an array of words with the alternating phases a–d is once stored in the second 1024-bit RAM in the same format as shown in FIG. 6. Then, the first four words are read by means of a separate address counter. Thus, all the words with the phase a are read out of RAM. Next, all the words with the phase b are read out. Similar reading operations are performed for the phases c and d. In consequence, phase separation is done. Hence, data is read, 1 bit at a time, from the second RAM in the order a0(0), a0(1), . . . , a0(31), a1(0), a1(31), . . . , a7(31), b0(0), . . . , b7(31), . . . , d7(31).

As described above, the prior art deinterleaver rearranges bit lines and word lines of data and then separates words according to the phases. Therefore, two RAMs for holding data and associated address counters have been required. For this reason, a memory having a capacity twice as large as the data amount of data in a block is required. Furthermore, a control unit for this memory is necessary. Consequently, the size of the deinterleaver is increased and its structure is complicated.

SUMMARY OF THE INVENTION

Accordingly, in the present invention, word lines and bit lines in each block where plural phases are cyclically assigned to each word are interchanged to deinterleave interleaved data. At this time, bit lines and word lines of the data are rearranged and simultaneous phase separation is performed in the manner described below.

A storage means has a storage area being a capacity corresponding to one block of data. The storage area has individual storage locations addressed by higher and lower significant addresses. Each bit of the above-described data is stored in each individual storage location in the storage means. Data is read, 1 bit at a time, from the storage means by specifying higher and lower significant addresses in turn. A newly incoming data item is written into the storage location just read out. Whenever a block of data is written, first and second count signals for specifying higher and lower significant addresses, respectively, are interchanged. At this time, a counting rule about the first and second count signals is cyclically changed as the phase is cyclically changed. In this manner, the word lines and bit lines are rearranged. A deinterleaved output is produced such that words are arranged according to phase. This can reduce the whole storage capacity to the amount of data corresponding to a block. Hence, the size of the apparatus can be reduced, and the structure can be simplified, thereby resulting in a highly cost-effective deinterleaver.

With a deinterleaver in accordance with the present invention, a word of data consists of $2^n$ bits (n is an integer equal to or greater than 2), and a block consists of $2^n$ words. In each block, plural phases are assigned to each word cyclically to form a first data row. In each word, a row from the first bit to the final bit is referred to as a bit line. In each block, a row from the first word to the final word is referred to as a word line. Each block is regarded as a matrix consisting of word lines and bit lines. The word lines and bit lines in each block are rearranged into a second data line. The deinterleaver deinterleaves this second data line and includes a storage means having storage locations for storing $2^{2n}$ bits of data and a control means. Each bit of data is identified by a higher significant address and a lower significant address which are formed by the higher significant n bits and the lower significant n bits, respectively, of 2n bits comprising an address. Each bit of data in the second data line is stored in each of the storage locations. The control means reads one bit of data at a time from the storage means by specifying the aforementioned higher and lower significant addresses.

The control means writes a newly incoming data in the second data line into the storage location from which data was just read out. Whenever one block of the second data line is written, signals for specifying the higher and lower significant addresses are interchanged and first and second count signals are interchanged as mentioned above. The counting rule is cyclically changed according to cycling of phase. The second data line is written into the storage means and read from it. In this way, a third data line obtained by rearranging the first data line such that words are arranged according to phase is produced.

The first data is obtained by separating each word into $2^k$ phases cyclically in each block (k is an integer greater than 1 and less than n). The control means comprises a 2n-bit counter, a first selector means, and a second selector means. The first selector means receives the higher significant n bits of the output from the counter and produces the first counter signal in which the higher significant k bits of the higher significant n bits described above have been shifted into lower significant bits cyclically. The second selector means receives the lower significant n-bit output from the counter and produces the aforementioned second count signal in which the higher significant k bits of the lower significant n-bit output have been shifted into lower significant bits cyclically. The aforementioned shifts in the first and second count signals are preferably made alternately to modify the counting rule.

For example, each word is preferably comprised of 32 bits of data, and each block consists of 32 words. The first data line is obtained by separating each word into 4 phases cyclically in each block. The control means comprises a 10-bit counter, a first selector means, and a second selector means. The first selector means receives the higher significant 5 bit output from the counter and produces the first count signal in which the higher significant 2 bits of the received higher significant 5 bits have been shifted into lower significant bits cyclically. The second selector means receives the lower significant 5 bit-output from the counter and produces the second count signal in which the higher significant 2 bits of the lower significant 5 bits of the output have been shifted into lower significant bits cyclically. The aforementioned shifts in the first and second count signals are made alternately to modify the counting rule.

Other objects and features of the invention will appear in the course of the description thereof, which follows.

BRIEF DESCRIPTION OF THE DRAWINGS

FIG. 3 is a table illustrating the operation of the deinterleaver shown in FIG. 1.

FIG. 4 is a diagram illustrating the operation of the deinterleaver shown in FIG. 1.

FIG. 5 is a diagram illustrating the operation of the deinterleaver shown in FIG. 1.

FIG. 6 is a diagram illustrating the prior art interleaving;

FIG. 7 is a diagram illustrating the prior art interleaving; and

FIG. 8 is a diagram illustrating the prior art interleaving.

DESCRIPTION OF THE PREFERRED EMBODIMENTS

Figure 1:
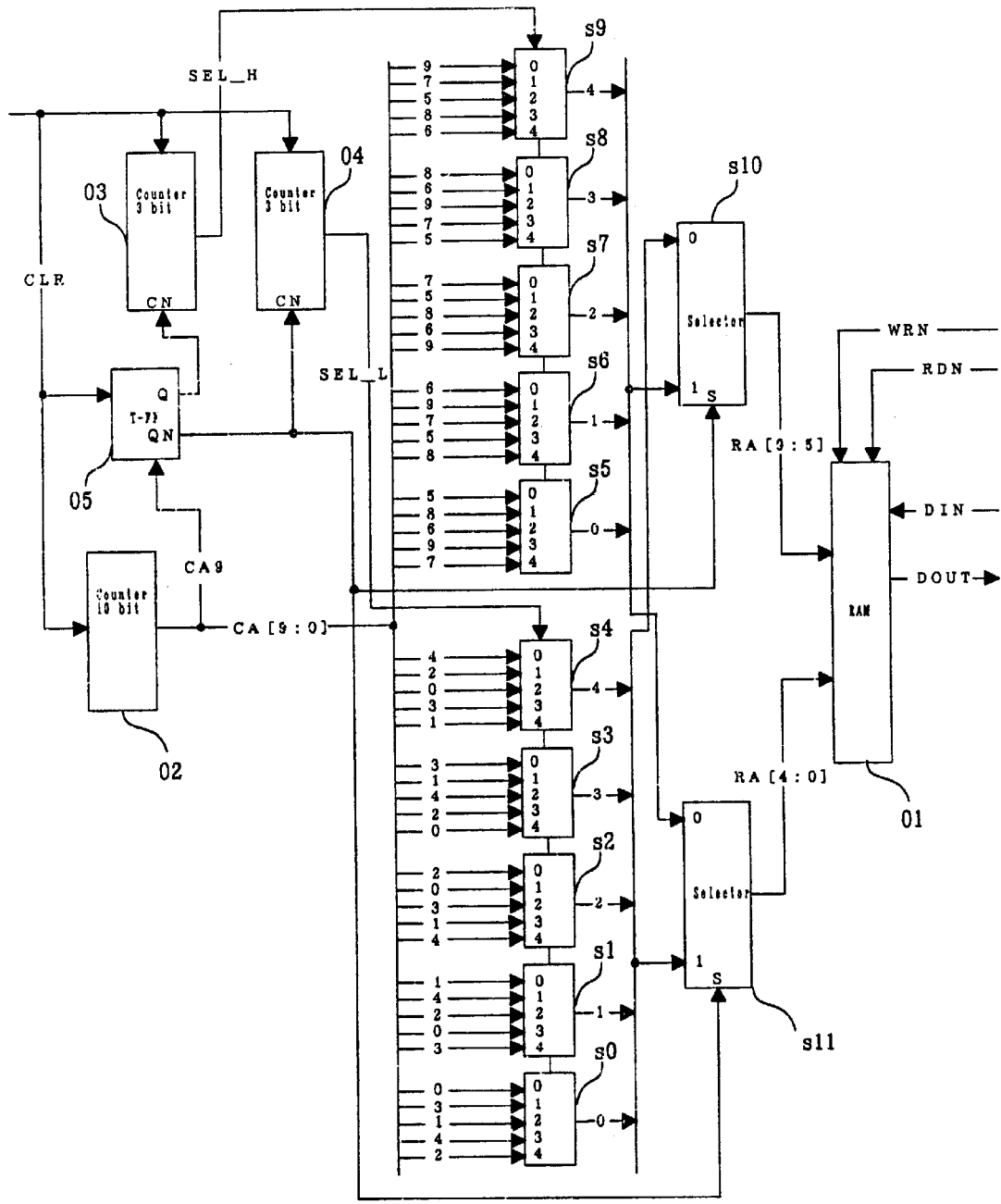
FIG. 1 is a diagram of a deinterleaver in accordance with one embodiment of the present invention.

A deinterleaver in accordance with one embodiment of the present invention is shown in FIG. 1. In this embodiment, 32-bits of data comprise a word, and 32 words (1024 bits) comprise a block, as shown in FIG. 6. In each block of data, each word is separated into four phases a–d, and data is multiplexed so that words with cyclically different phases are arranged. A block of data is interleaved by interchanging bit lines and word lines. Each data row arranged as shown in FIG. 6 is identified by [phase name], [word number], and ([bit number]). After an interleaving process is completed, data is transmitted, 1 bit at a time, in the order a0(0), b0(0), c0(0), d0(0), a1(0), . . . , d6(31), a7(31), b7(31), c7(31), d7(31). These successive bits of data are successively provided to the deinterleaver of the instant invention.

Referring to FIG. 1, a storage means consists of a RAM 01 having storage locations corresponding to one block of data, (i.e., 1024 bits of data). Data can be written to, or read from RAM 01 one bit at a time. RAM 01 has 10 address lines to specify storage locations from address 0 to address 1023. The address lines are divided into higher significant 5 bits and lower significant 5 bits, which indicate a higher significant address and a lower significant address, respectively. Individual addresses are specified by combinations of these upper and lower significant addresses. In the same way as in the description of the prior art technique described above, the address lines from the higher significant bit to the lower significant bit are conveniently denoted as RA[9:0]. For example, address line RA[5] indicates the address line of the sixth lower significant bit. RAM 01 address lines RA[9:0] are received from a selector (described in more detail below). An output from the selector arriving at address line RA[9:5] specifies the higher significant addresses. An output from the selector arriving at address line RA[4:0] specifies lower significant addresses. When line WRN goes high (H), interleaved data provided on line DIN is written into storage locations determined by the upper and lower significant addresses. When line RDN goes high (H), data is read from the storage locations onto line DOUT.

A 10-bit counter 02, 3-bit counters 03 and 04, selectors s0–s11, and flip-flop 05 form a control means. Selectors s5–s9 constitute a first selector means, while the selectors s0–s4 form a second selector means. The counter 02 counts reference clock pulses generated from a reference clock pulse generator (not shown) from 0 to 1023 cyclically, and produces a 10-bit output indicating the counter's value. The bits of the 10-bit output from the most significant bit to the least significant bit are conveniently denoted as output CA[9:0] in the same way as in the description of the prior art technique. For example, output CA[5] indicates an output of the sixth lower significant bit.

Flip-flop 05 is used as a toggle. Whenever the output CA[9] of the counter 02 drops from level H to level L, flip-flop 05 inverts the outputs at the output terminals Q and QN.

The counters 03 and 04 receive outputs from output terminals Q and QN, respectively, of the flip-flop 05. The total count of each counter is incremented with every leading edge of the incoming signal. The total count is cycled from 0 to 4. Although each counter is designated as a 3-bit counter in FIG. 1, the full count, or $2^3$ (i.e., 8), is not reached, (i.e., the total count is not cycled from 0 to 7). Rather, the total count is cycled from 0 to 4 (i.e., 0, 1, 2, 3, 4, 0, 1, 2, etc.).

The output CA[4:0] from the counter 02 is sent to selectors s0–s4, and the output CA[9:5] is sent to selectors s5–s9. Symbols 0–9 attached to the line extending from the counter 02 indicate outputs CA[0]–CA[9], respectively. Symbols 0–4 attached to the selectors s0–s9 indicate the zeroth through fourth input terminals, respectively. The input terminals receive output CA[9:5] or CA[4:0] as shown in FIG. 1. For example, with respect to the selector s0, the zeroth input terminal receives the output CA[0], first input terminal receives the output CA[3], the second input terminal receives the output CA[1], the third input terminal receives the output CA[4], and the fourth input terminal receives the output CA[2]. Selectors s5–s9 select outputs received at the zeroth through fourth input terminals, respectively, according to the total count, from 0 to 4, of counter 03. Similarly, selectors s0–s4 produce outputs CA[0], CA[3], CA[1], CA[4], and CA[2] when the value of the counter 04 becomes 0, 1, 2, 3, and 4, respectively. For example, if the total count of the counter 04 reaches 0, 1, 2, 3, and 4 in turn, the selector s0 produces outputs CA[0], CA[3], CA[1], CA[4], and CA[2] in turn. The outputs from selectors s0–s4 are assigned to the first through fifth bits, respectively, of the 5 bits sent to the address line RA[4:0] or address line RA[9:5] by selectors s10 and s11. Similarly, the outputs from selectors s5–s9 are assigned to the first through fifth bits, respectively, of the 5 bits sent to the address line RA[4:0] or address line RA[9:5].

Selectors s10 and s11 receive the outputs from selectors s0–s9 and send either 5-bit outputs from the selectors s0–s4 or 5-bit outputs from selectors s5–s9 to the address lines RA[9:5] and RA[4:0] according to the output at the output terminal QN of flip-flop 05. In particular, selectors s10 and s11 have input ports designated "0" and "1" for receiving 5-bit input data. Selector s10 has its input port "1" receiving the outputs from selectors s5–s9 and its input port "0" receiving the outputs from selectors s0–s4. The selector s11 has its input port "1" receiving the outputs from selectors s0–s4 and its input port "0" receiving the outputs from selectors s5–s9. When the output terminal QN is high (H) selectors s10 and s11 select the output received at the input port "1", and when the terminal QN is low (L), the selectors select the output received at the input port "0". Selector s10 distributes the outputs from selectors s0–s4 or the outputs from selectors s5–s9 to the address lines RA[5]–RA[9] as follows: the output from selector s0 is sent to the address line RA[5], the output from selector s1 is sent to the address line RA[6], the output from selector s2 is sent to the address line RA[7], the output from selector s3 is sent to the address line RA[8], and the output from selector s4 is sent to the address line RA[9]. Similarly, selector s11 sends the outputs from selectors s0–s4, or from selectors s5–s9, to the address lines RA[0]–RA[4].

Figure 2:
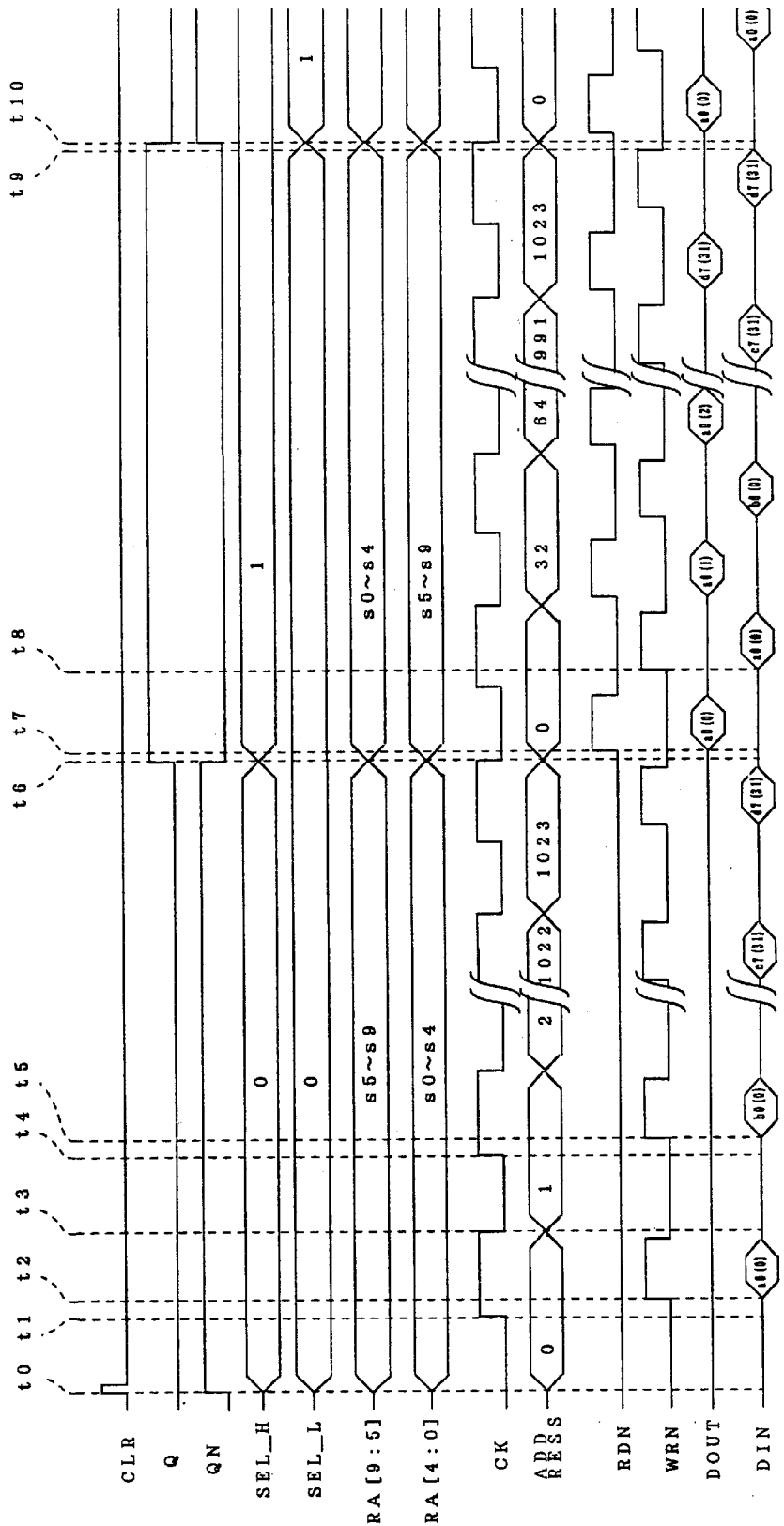
FIG. 2 is a timing chart illustrating the operation of the deinterleaver shown in FIG. 1.

The operation of the present deinterleaver is next described with reference to the timing chart of FIG. 2. The writing of data of the first block is described first. In FIG. 2, "SEL-H" and "SEL-L" indicate the total counts of the counters 03 and 04, respectively. ADDRESS indicates an address in the storage device specified at each instant of time.

First, at instant of time t0, an output appearing at line CLR resets counters 02–04 and flip-flop 05. Thus, the total counts of counters 02–04 are all zero, the output terminals Q and QN of flip-flop 05 are low (L) and high (H), respectively, selectors s9–s0 produce outputs CA[9]–CA[0], respectively, the selector s10 causes the outputs from selectors s9–s5 to be sent to the address lines RA[9]–RA[5], respectively, and selector s11 causes the outputs from selectors s4–s0 to be sent to the address lines RA[4]–RA[0], respectively.

As a result, the data of the first block is sent to the address line RA[9:0] such that the order of the bits of the output CA[9:0] is not varied. The relationships of the outputs CA[9:5] and CA[4:0] from the counter 02 to the address lines RA[9:5] and RA[4:0] is shown in FIG. 3 whenever data of a new block is entered.

In FIG. 3, the leftmost column indicates what block is being entered. The second column indicates the relationship of the address lines RA[9:5] to the output CA[9:5] or the output CA[4:0] in each block. The third column indicates the relationships of the address lines RA[4:0] to the output CA[9:5] or output CA[4:0] in each block. The fourth column indicates the total count of the counter 03, and the fifth column indicates the total count of the counter 04.

For example, with respect to address lines RA[4:0] and the first data block, address lines RA[ 4, 3, 2, 1, 0] and the underlying outputs CA[4, 3, 2, 1, 0] cause the output CA[4] to be sent to the address line RA[4], the output CA[3] to be sent to the address line RA[3], the output CA[2] to be sent to the address line RA[2], the output CA[1] to be sent to the address line RA[1], and the output CA[0] to be sent to the address line RA[0]. With respect to the second block, the underlying outputs CA[7, 6, 5, 9, 8] cause the output CA[7] to be sent to address line RA[4], the output CA[6] to be sent to the address line RA[3], the output CA[5] to be sent to the address line RA[2], the output CA[9] to be sent to the address line RA[1], and the output CA[8] to be sent to the address line RA[0].

Referring back to FIG. 2, the aforementioned resetting starts generation of reference clock pulses CK from a reference clock pulse generator (not shown). The data items in the first block are sent in turn to the RAM 01 in synchronism with the reference clock pulses. That is, if the reference clock pulse CK goes high (H) at instant of time t1, the first data item a0(0) is sent to the RAM 01. If the line WRN goes high (H) at instant t2, the first data item a0(0) is written into a storage location addressed by the address lines RA[9:5] and RA[4:0]. In this example, the value of the counter 02 is 0, addressing a storage location having address 0. The first data item a0(0) is written into this storage location. The states of the output CA[9:0] and address line RA[9:0] indicate bits, in binary notation, of 10 bits. In this example, both indicate 0000000000, specifying address 0.

If the reference clock pulse CK goes low (L) at instant t3, the value of the counter 02 reaches 1, causing the address line RA[0] to go high (H). Thus, the address in the storage into which the next data item is written is 1. If the reference clock pulse goes high (H) at instant t4, the second data item b0(0) is sent to the RAM 01. If the line WRN goes high (H) at the next timing t5, the second data item b0(0) is written into the storage location having the address 1.

Subsequently, data items are similarly written into memory addresses identical with the value of the counter 02, and when the value of the counter 02 reaches 1023, the writing of all data items in the first block ends.

Accordingly, the data items are stored as per the array shown in FIG. 4. In this example, the bits of the words define the plurality of columns, (i.e., in the direction of higher significant, addresses). Words having phases a–d are arranged in the direction of rows, (i.e., in the direction of lower significant addresses). It follows that words of the same phase are at every fourth location.

When the value of the counter 02 reaches 512, the output CA[9] is high (H). At instant t6 immediately after the counter's value reaches 1023, the value of the counter 02 is again reset to 0 on the trailing edge of the reference clock pulse CK. This causes the output CA[9] to go low (L). The trailing edge of the output CA[9] causes the terminals Q and QN of flip-flop 05 to go high (H) and low (L), respectively. The counter 03 counts the leading edges of the output from the terminal Q and assumes a total count of 1. This causes selectors s5–s9 to send the input received by the first input terminal instead of the zeroth input terminal. That is, the selectors s5–s9 produce outputs CA[8], CA [9], CA[5], CA [6], and CA[7]. The outputs from the terminals Q and QN of flip-flop 05 are inverted, so that the input ports "0" of selectors s10 and s11 receive their outputs instead of the input ports "1". Selector s10 sends the outputs from selectors s4–s0 to the address line RA[9:5]; and the selector s11 sends the outputs from the selectors s9–s5 to the address line RA[4:0]. As shown in the block number 2 row in FIG. 3, the higher significant 5 bits and the lower significant 5 bits of the output from the counter 02 specifying the higher significant addresses and the lower significant addresses in the RAM 01 are interchanged. Furthermore, with respect to the higher significant 5 bits of the output now specifying the lower significant address, the outputs CA[9] and CA[8] that were formerly higher significant 2 bits are shifted into lower significant bits cyclically. In consequence, the bits forming the lower significant address are shifted by 2 bits. Thus, the bits forming the lower significant address are shifted by 2 bits within the lower significant addresses.

When the terminal RDN goes high (H) at instant t7, the first data item a0(0) in the first block stored in the storage location of address 0 in the RAM 01 is read out and provided on the terminal DOUT. At instant t8 immediately thereafter, the terminal WRN goes high, and the first data item a0(0) in the second block entered from the terminal DIN is written into the address 0 from which data has just been read out. When the reference clock pulse CK rises subsequently, the counter 02 has a value of 1, and the address line RA[5] goes high. Thus, the address lines RA[9:0] indicates 0000100000. The storage location into which the next data item is written is 32. At the leading edge of the output at the terminal WRN, the data item a0(1) in the first block is read out. At the leading edge of the output at the terminal RDN, the data item b0(0) in the second block is written. When the next reference clock CK rises, the counter 02 has a value of 2, and the address line [6] of the address lines RA[9:5] specifying higher significant addresses goes high (H). Thus, the address lines RA[9:0] indicates 0001000000. The storage location into which the next data item is written is 64. On the leading edge of the output at the terminal WRN, the data item a0(2) in the first block is read out, and on the leading edge of the output at the terminal RDN, the data item c0(0) in the second block is written to RAM 01. Subsequently, data items are successively read out similarly from the lower significant address 0 in the direction of the columns, and a newly received data item is written into the address from which data was just read out.

If the lower significant address is set to 0, and if writing is done up to the higher significant address 31, the value of the counter 02 becomes 32 and the output CA[5] from the counter 02 goes high. This causes the address line RA[2] to go high via selectors s7 and s11. The address line RA[9:0] assumes state 0000000100. A lower significant address 4 is specified next to lower significant address 0. With respect to lower significant address 4, data items are successively read and written in the direction of rows up to higher significant address 31. Then, the value of the counter 02 assumes value 64, and the output CA[6] from the counter 02 goes high. This causes the address line RA[3] to go high via selectors s8 and s11. The address line RA[9:10] indicates 0000001000. A lower significant address 8 is specified next to the lower significant address 0. With respect to the lower significant address 8, data items are successively read out and written in the direction of columns up to a higher significant address 31. When the value of the counter 02 becomes 96, the outputs CA[5] and CA[6] from the counter 02 go high. This causes the address lines RA[3] and RA[4] to go high via selectors s7 and s8, respectively, and via selector s11, and the address line RA[9:0] assumes the state 0000001100. A lower significant address 12 is specified next to the lower significant address 0. Subsequently, data items are similarly read out up to a lower significant address 28. The arrangement of the word lines and bit lines are returned to the original form such as a0(0), a0(1), . . . , a0(31), a1(0), . . . , a1(31), . . . , a7(31), and phase separation is done. Under this condition, data items are produced from the RAM 01.

Subsequently, data items of other phases are read out similarly. In particular, the value of the counter 02 becomes 256. The output CA[8] from the counter 02 goes high (H), which causes the address line RA[0] to go high via selectors s5 and s11. The address line RA[9:0] assumes the state 0000000001 specifying the lower significant address 1. Subsequently, every four lower significant addresses are specified, and data items are read out in the direction of rows. In this way, data items of phase b are output as b0(0), b0(1), . . . , b0(31), b1(0), . . . , b1(31), . . . , b7(31).

When the value of the counter 02 becomes 512, the output CA[9] from the counter 02 goes high. This causes the address line RA[1] to go high via selectors s6 and s11, and the address line RA[9:0] assumes state 0000000010, specifying a lower significant address 2. Subsequently, every four lower significant addresses are specified, and data items are read out in the direction of columns. Thus, data items of phase c are output as c0(0), c0(1), . . . , c0(31), c1(0), . . . , c1(31), . . . , c7(31). Similarly, when the value of the counter 02 becomes 768, the outputs CA[8] and CA[9] from the counter 02 go high. This causes the address lines RA[0] and RA[1] to go high via the selectors s5 and s6, respectively, and via the selector s11 and the address line RA[9:0] takes state 0000000011, specifying a lower significant address 3. Subsequently, every four lower significant addresses are specified. Data items are read out in the direction of columns. In this manner, data items about phase d are output as d0(0), d0(1), . . . , d0(31), d1(0), . . . , d1(31), . . ., d7(31), and deinterleaving of the data items in the first block is completed.

Figure 5:
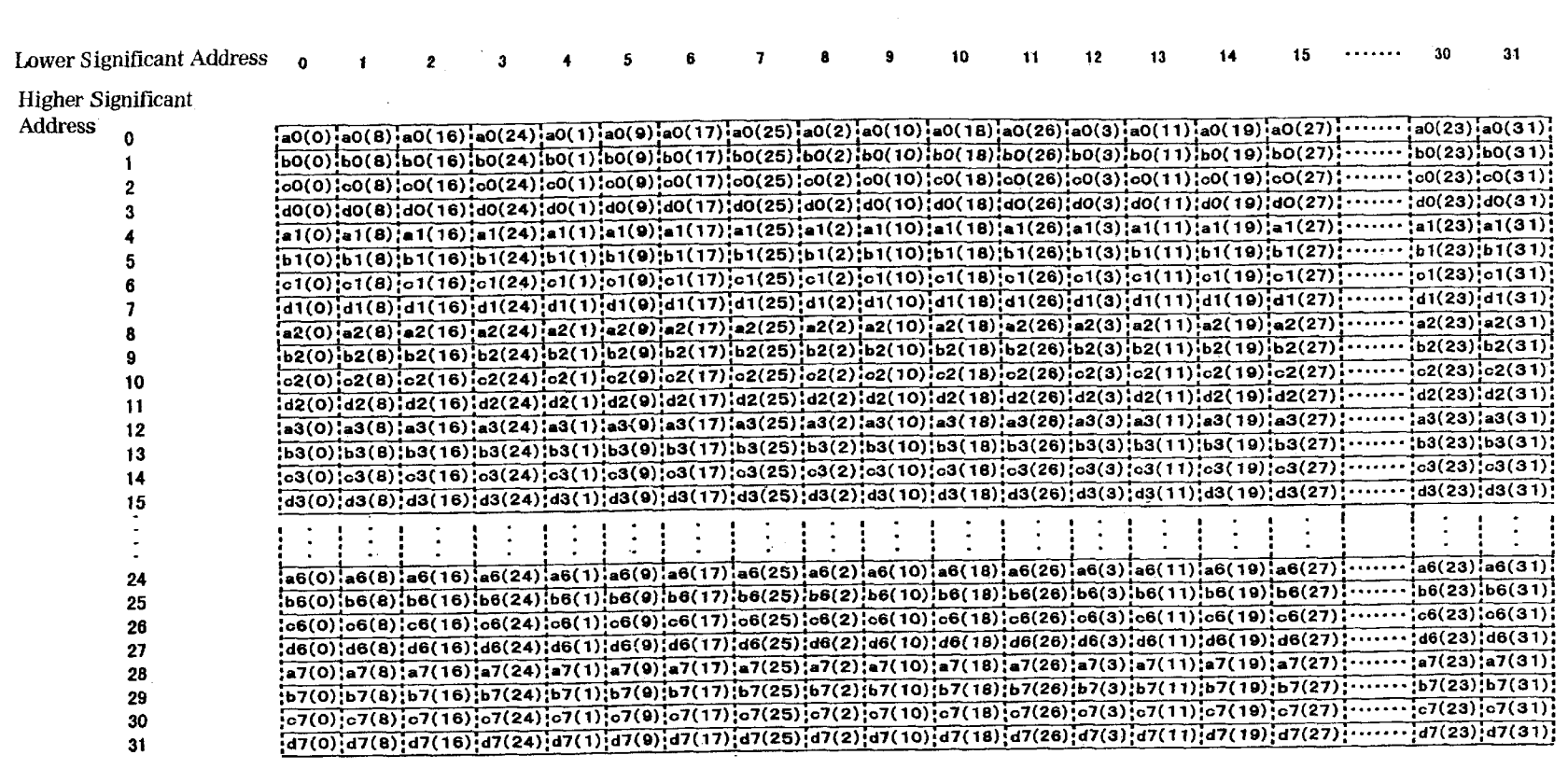

At instant t9 immediately after the completion of interleaving of the data items in the first block, the writing of data items in the second block is complete, and the data items are stored in the RAM 01 in the format as shown in FIG. 5. That is, the bits of words are arranged in the direction of rows in the order determined by specifying the order when the lower significant address is specified by the shifted (or, rearranged) higher significant 5 bits of the output from the counter 02 in reading data items in the first block. In the direction of columns, the lower significant 5 bits of the output from the counter 02 have not been shifted. Therefore, the incoming data items are arranged without changing the order. Words of phases a–d are placed in order, and words of the same phase are located at every four locations.

Reference clock pulse CK falls at instant t10, resetting the value of the counter 02 to 0. This causes the output CA[9] to go low (L). In response, the terminals Q and QN of flip-flop 05 go low and high, respectively.

The counter 04 counts the leading edge of the output from the terminal QN, and exhibits a total count of 1. In response, selectors s0–s4 send an input received by the first input terminal instead of the zeroth input terminal. That is, the selectors s0–s4 produce outputs CA[3], CA[4], CA[0], CA[1], CA[2]. As the outputs from the terminals Q and QN of flip-flop 05 are inverted, the input ports "1" of the selectors s10 and s11 receive the outputs instead of the input ports "0". Consequently, the selector s10 sends the outputs from selectors s9–s5 to the address lines RA[9:5], and selector s11 sends the outputs from the selectors s4–s0 to the address lines RA[4:0]. As indicated by the block 3 row in FIG. 3, the lower significant 5 bits and higher significant 5 bits of the output from the counter 02 which have specified the higher and lower significant addresses, respectively, in the RAM 01 are interchanged. Also, with respect to the lower significant 5 bits of the output now specifying the lower significant address, the outputs CA[4] and CA[3] that were higher significant 2 bits are shifted to lower significant bits cyclically. As a result of this shifting, every four lower significant addresses are specified by the lower significant 5 bits of the output from the counter 02 such that the initial value is cycled from 0 to 3. That is, when data in the second block is written, every four lower significant addresses are specified cyclically such that the initial value is cycled from 0 to 3 by the shifted, higher significant 5 bits of the output from the counter 02.

Therefore, the bits of the words are arranged in this order. At this time, the bits are read out in the same order by the similarly shifted, lower significant 5 bits of the output. With respect to higher significant addresses, words are arranged by being specified by unshifted, lower significant 5 bits of the output from the counter 02. The words are arranged in the same order as when lower significant addresses are specified during the previous reading operation. With respect to the higher significant 5 bits of the output from the counter 02 presently used to specify higher significant addresses, bits are not rearranged.

The order used in the previous reading operation may be used. Thus, data items can be read from the second block in the same order as from the first block by repeating the reading and writing operations in response to the aforementioned reference clock pulses CK.

As data in the second block is read out, data is written into the third block. During the present data writing, shifting of the lower significant 5 bits of the output from the counter 02 shifts the array of the words of the same phase correspondingly. In this example, words of the same phase appear at every 16 lower significant addresses. Therefore, when data in the third block is read out, the higher significant 2 bits of the higher significant 5 bits of the output from the counter 02 specifying lower significant addresses as indicated by the block 4 row, are shifted toward lower significant bits in the same way as in the shifting process described above. Thus, words of the same phase can be read consecutively. With respect to higher significant addresses, the bits of words are arranged according to the higher significant 5 bits of the output from the counter 02 that was not shifted in the previous operation and so it is not necessary at this time to shift the lower significant 5 bits of the output from the counter 02 for specifying higher significant addresses.

Subsequently, whenever writing of all the data in each block is completed, the higher significant 5 bits and the lower significant 5 bits of the output from the counter 02 are interchanged to specify higher and lower significant addresses as shown in FIG. 3. The portion for switching the output from the higher significant addresses to lower significant addresses shifts the higher significant 2 bits toward lower significant bits. The data items in the blocks are deinterleaved as a0(0), a0(1), . . . , a0(31), a1(0), . . . , a1(31), . . . , a7(31), b0(0), . . . , b7(31), d7(31). In the output signal, the word lines and bit lines are rearranged, and in addition, the phase separation is done. When these data items are read out after writing of the data in the tenth block is completed, the output from the counter 02 specifying higher and lower significant addresses assumes the original state as indicated by the block 11 in FIG. 3, (i.e., the original state appears at every 10 blocks).

As described in the present embodiment, rearrangement of word lines and bit lines can be performed simultaneously with phase separation. Therefore, the total storage capacity can be reduced to the amount of data in a block. Hence, the size of the apparatus can be reduced and the structure can be simplified, thereby resulting in a highly cost-effective deinterleaver.

In the embodiment described above, 1 block of interleaved data consists of 32 bits, 32 words, and 4 phases. However, the present invention is not limited to this configuration. For example, where there are 8 phases, the zeroth through fourth input terminals of the selectors s0–s9 may be so set as to shift the higher significant 3 bits of the higher significant 5 bits or lower significant 5 bits of the output from the counter 02 toward lower significant bits cyclically. Where a block is composed of 64 words and 4 phases and each word consists of 64 bits, a 4096-bit RAM is used. Whenever 1 block of data is written, the higher significant 6 bits and the lower significant 6 bits are alternately specified by the higher significant 6 bits and the lower significant 6 bits of the 12-bit output from the counter. With respect to the output from the counter, the higher significant 2 bits are alternately shifted toward lower significant bits cyclically. In this way, a block of data can be deinterleaved in the same way as in the embodiment described above. In particular, with respect to the structure of one block, 2-bit data (n is an integer equal to or greater than 2) comprises 1 word, and $2^n$ words comprise a block. In each block, words are separated into $2^k$ phases (k is an integer equal to or greater than 1 and less than n) cyclically. It is only necessary that the RAM acting as a storage means have storage locations corresponding to $2^{2n}$ bits. The counter is is only required to produce an output of 2n bits. The higher and lower significant addresses of n bits in the RAM are specified by the higher significant n bits and the lower significant n bits, alternately, of the output from the counter. When the specified higher and lower significant addresses are switched, the higher significant k bits are alternately shifted toward lower significant bits.

In accordance with the present invention, rearrangement of word lines and bit lines and separation of phases can be performed simultaneously. The whole storage capacity can be reduced to the amount of data in block units. The size of the apparatus can be reduced, thereby making the structure simpler and more cost-effective.

What is claimed is:

1. A deinterleaver for taking $2^n$ bits of (N is an integer equal to or greater than 2) as one word, taking $2^n$ words as one block, separating each word in each block into a plurality of phases cyclically to form a first data row, taking a row of bits including a forefront bit and a final bit in each word from said forefront bit of said word to said final bit of said word as a bit row, regarding each block as a matrix consisting of word lines x bit lines, rearranging the work lies and bit lines in each block of said first data row to form a second data row that is to be deinterleaved, said deinterleaver comprising:

(a) a single RAM means having storage locations corresponding to $2^n$ bits each identified by a higher significant address and a lower significant address that are formed by higher significant n bits and lower significant n bits, respectively, each storage locations storing one bit of said second data row; and (b) a control means acting to read data from said storage locations, one bit at a time, by setting said higher and lower significant addresses to successive values, to write said second data row newly arriving into each of said storage locations just read out, to interchange signals for setting said higher and lower significant addresses whenever one block of the second data row is written, to treat said signals interchanged as first and second count signals, and to cause said first and second count signals to change a count rule of said first and second count signals alternately and cyclically according to cycling of said phases when said signals are interchanged; and wherein said second data row is written into and read from said storage means to produce a third data row equivalent to a data row obtained by rearranging said first data row such that said words are arranged and corrected at every phases, and said every arranged and corrected words are arranged in order of said phases.

2. The deinterleaver of claim 1 wherein said control means further includes data writing means for writing a bit of a second from a second block of data into said storage location from which data has just been read.

3. The deinterleaver of claim 1 wherein the number of said plurality of phases is $2^k$, wherein k is an integer greater than 1 and less than n.

4. The deinterleaver of claim 3 wherein n is equal to 5 and k is equal to 2.

5. A deinterleaver for receiving at least one block of interleaved data, said block of data comprising $2^n$ words and said words comprising $2^n$ bits, wherein n is an interger greater than or equal to 2, each of said words being associated with one of a plurality of phases, said deinterleaver comprising:

(a) a storage means comprising $2^{2n}$ storage locations, each of said storage locations identified by a first address of n bits and a second address of n bits, each of said storage locations storing one bit of said interleaved data; and (b) a control means coupled to said storage means for generating said first and second addresses such that said words of each phase are read sequentially, and said bits of said words read sequentially;

said control means comprised of a $2^{2n}$ bit counter, a first selector means for receiving the higher significant n bits output from said counter and producing a first count signal by shifting the higher significant k bits of said output of said higher significant n bits into lower significant bits, and a second selector means for receiving the lower significant n bits output from said counter and producing a second count signal by shifting the higher significant k bits of the output of said lower significant n bits into lower significant bits.

6. The deinterleaver of claim 5 wherein n is equal to 5 and k is equal to 2.

* * * * *